US006338284B1

(12) United States Patent
Najafi et al.

(10) Patent No.: US 6,338,284 B1
(45) Date of Patent: Jan. 15, 2002

(54) ELECTRICAL FEEDTHROUGH STRUCTURES FOR MICROMACHINED DEVICES AND METHODS OF FABRICATING THE SAME

(75) Inventors: Nader Najafi; Yafan Zhang, both of Ann Arbor, MI (US); Terry Hull, Vancouver, WA (US)

(73) Assignee: Integrated Sensing Systems (ISSYS) Inc., Ann Arbor, MI (US)

(*) Notice: Subject to any disclaimer, the term of this patent is extended or adjusted under 35 U.S.C. 154(b) by 0 days.

(21) Appl. No.: 09/249,706

(22) Filed: Feb. 12, 1999

(51) Int. Cl.[7] .............................. G01D 5/24; G01P 9/12
(52) U.S. Cl. .................... 73/866.1; 29/25.41; 216/2; 73/718; 73/861.47; 361/283.4
(58) Field of Search ................... 73/866.1, 724, 73/718, 861, 861.47; 361/283.1, 283.3, 283.4, 285, 302, 600; 216/2; 29/25.41

(56) References Cited

U.S. PATENT DOCUMENTS

| | | | |
|---|---|---|---|
| 4,386,453 A | | 6/1983 | Giachino et al. ......... 29/25.41 |
| 4,625,561 A | * | 12/1986 | Mikkor ................... 361/283.1 |
| 4,679,867 A | * | 7/1987 | Heldenbrand et al. ...... 312/287 |
| 4,701,424 A | * | 10/1987 | Mikkor ................. 29/25.41 X |
| 4,701,826 A | * | 10/1987 | Mikkor ................... 361/283.4 |
| 4,773,972 A | * | 9/1988 | Mikkor ..................... 73/724 X |
| 5,144,946 A | * | 9/1992 | Weinberg et al. ............. 607/2 |
| 5,264,075 A | | 11/1993 | Zanini-Fisher et al. ..... 156/633 |
| 5,381,299 A | | 1/1995 | Provenzano et al. ..... 361/283.4 |
| 5,528,452 A | | 6/1996 | Ko .......................... 361/283.4 |

* cited by examiner

Primary Examiner—Thomas P. Noland
(74) Attorney, Agent, or Firm—Gifford, Krass, Groh, Sprinkle, Anderson & Citkowski, PC

(57) ABSTRACT

Structures and methods are disclosed in conjunction with the fabrication of electrical lead transfer feedthroughs with respect to a sealed cavity. In some applications such as capacitive pressure sensing, the cavity may include an outer wall, in which case the electrically insulating barrier is preferably U-shaped, with the ends of the U terminating at the outer wall. The feedthrough section may alternatively take the form of an island of conductive material surrounded by the electrically insulating barrier, thus assuming an O-shape. The cavity may be evacuated or filled with specific gases at specific pressures. As such, the invention finds application in the packaging (vacuum or controlled environment) and production of a variety of transducers including but not limited to pressure sensors, flow sensors, optical devices (e.g., infrared detectors, ccd camera, and flat-panel displays) and resonating devices, such as gyroscopes, accelerometers, yaw sensors, telecommunication devices, etc. Multiple lead transfer feedthroughs may also be produced using this invention.

20 Claims, 5 Drawing Sheets

ELECTRICAL FEEDTHROUGH STRUCTURES FOR MICROMACHINED DEVICES AND METHODS OF FABRICATING THE SAME

This invention was made with Government support under Contract F30602-97-2-0105 awarded by the Air Force. The Government has certain rights in this invention.

FIELD OF THE INVENTION

This invention relates generally to sealed micromachined sensors, actuators, and structures such as capacitive pressure sensors and, in particular, to electrical lead transfer technologies and methods of realizing feedthrough structures from inside a sealed cavity to an area outside that can be conveniently accessed.

BACKGROUND OF THE INVENTION

One of the most difficult problems in the design, fabrication, and commercialization of micromachined sensors and actuators resides in the realization of electrical feedthroughs that can be conveniently accessed outside of a sealed cavity of micromachined device(s). The sealed cavity can play a few major roles, including but not limited to housing the micromachined device, a reference cavity, and a sensing cavity. Although several electrical lead transfer techniques have been developed for capacitive absolute pressure sensors, the designs present technical drawbacks that limit their applicability.

One approach uses a pn-junction feedthrough. In this technique, n-type silicon is used as the silicon substrate and it is then diffused to create a p+ silicon diaphragm (the upper electrode). The bottom electrode of the pressure measurement capacitor is made by two separate metal patterns on the glass substrate wafer. The two metal parts are connected during the anodic (electrostatic) bonding process via the diffused p+ feedthroughs which are fabricated on the N-type silicon. The technique, however, suffers from major problems associated with P-N junctions. For example, it exhibits a high temperature dependence and drift as well as junction noise and reverse leakage currents. As a result, this technique fails to provide high quality, reliable feedthroughs at a reasonable cost.

An improved approach utilizes polysilicon electrical feedthroughs in conjunction with a deposited dielectric layer, such as silicon oxide or silicon nitride. Anodic bonding is used between polysilicon (and silicon dioxide) and a glass substrate, as opposed to single-crystal silicon and a glass substrate. Although the feasibility of this approach has been proven, the hermetic quality of the anodically bonded polysilicon to the glass warrants further investigation. Also, the fabrication process is quite complicated and surface non-uniformity may adversely affect yield.

U.S. Pat. No. 4,386,453 to Giachino et al. discloses a capacitive pressure sensor fabricated from a silicon wafer and a dielectric (glass) substrate using anodic bonding. Holes formed in the glass to provide electrical contact are subsequently sealed with solder. The major problems of this approach include low quality of sealing and outgassing of the solder refill, resulting in a reduced-vacuum pressure within the cavity.

U.S. Pat. No. 4,773,972 to Mikkor describes a method of fabricating a capacitive pressure sensor by anodically bonding two silicon wafers, each containing a capacitive plate. The process is quite complicated, including multiple etch steps and temperature-controlled conductor migration, resulting in challenges at the manufacturing level and above-vacuum pressure inside the cavity.

U.S. Pat. No. 5,264,075 avoids the need to drill holes or form complex conductive paths through a dielectric material, and also eliminates the use of solder plugs. The sensor is comprised of a silicon substrate bonded to a dielectric (glass) substrate. The silicon substrate includes a diaphragm formed by front- and back-side etching. This technology as described in this patent appears to be susceptible to certain yield-reducing steps. In particular, because sputtered material is used in the process, hermetic quality, step coverage, and outgassing inside the cavity are questionable.

U.S. Pat. No. 5,528,452 discloses a sensor constructed of two major components, a silicon diaphragm and a glass substrate. In comparison with the other techniques described above, the approach taught by this patent affords a much simpler fabrication process. However, bonding is used in conjunction with a deposited layer of reflow glass, rather than directly bonding to a glass wafer. Furthermore, metal lines penetrate through the silicon rim, creating problems relating to step coverage.

Monolithic Sensors Inc. has developed a capacitive sensor system made entirely of silicon, which minimizes problems associated with the thermal coefficient of expansion. The sensor incorporates a top plate having a mechanical pressure stop (silicon); a silicon diaphragm; and a back plate (also silicon) having CMOS circuitry. The three components are fabricated separately, and bonded together through eutectic soldering. Although the resulting system features a wide band of linearity, it is intended for differential pressure applications where absolute sealing is not required. Another non-sealed configuration is disclosed in U.S. Pat. No. 5,381,299, which provides a through-hole that allows a fluid whose pressure is being measured to contact the diaphragm.

Other techniques possess different drawbacks in terms of design, development, fabrication, manufacturing, and/or overall cost. In one case, a pressure sensor along with a glass frit of proper composition is placed into a vacuum furnace and heated to a defined temperature-time curve to melt the frit, resulting in a process which is very difficult to control. Another approach seals the reference cavity with a wafer-level process by sputtering Pyrex glass film over a channel opening. Due to these drawbacks in the prior art, the need remains for a low cost, reliable, hermetic sealing, and wafer-level feedthrough fabrication technique applicable to the packaging and manufacturing of micromachined devices.

SUMMARY OF THE INVENTION

This invention is directed toward structures and methods for the fabrication of electrical lead transfer feedthroughs with respect to a sealed cavity. The cavity may be evacuated or filled with specific gases at specific pressures. As such, the invention finds application in the packaging (vacuum or controlled environment) and production of a variety of transducers including but not limited to absolute pressure sensors, differential pressure sensors, flow sensors, mass flow controllers, fluidic products (e.g., drug delivery systems, valves, and chemical analysis systems), optical devices (e.g., infrared detectors, CCD camera, and flat-panel displays) and resonating devices, such as gyroscopes, accelerometers, yaw sensors, mechanical and electrical filters, oscillators, etc. Multiple lead transfer feedthroughs may also produced using this invention.

In a structure of the type wherein the bottom surface of a top substrate (which is usually but not necessarily substantially electrically conductive) is attached to the top surface of a bottom substrate (which is usually but not necessarily substantially electrically insulating) to provide the sealed cavity, an apparatus aspect of the invention provides means for interconnecting an electrically conductive element outside the cavity to an electrically conductive element within the cavity using a feedthrough section of the top substrate which makes electrical contact to both of the electrically conductive elements and an electrically insulating barrier formed in the top substrate to electrically isolate the feedthrough section from the rest of the top substrate. In a preferred embodiment, only a portion of the bottom surface of the feedthrough section of the top substrate overlaps with portions of the electrically conductive elements, enabling the entire rim to be bonded directly to the top surface of the substrate using techniques such as anodic bonding to ensure vacuum integrity where desirable. These techniques can be applied by two different categories: electrical access from top side of the top substrate, and access from the back side of the bottom insulating substrate via through holes in the bottom substrate (e.g., glass).

In some applications such as capacitive pressure sensing, the top substrate in the vicinity of the feedthrough section may include an outer wall, in which case the electrically insulating barrier is preferably U-shaped, with the ends of the U terminating at the outer wall. In another important embodiment, the feedthrough section is in the form of an island of conductive material surrounded by the electrically insulating barrier, preferably assuming an O-shaped island available for subsequent interconnection. This island is completely surrounded by both the electrically insulating barrier and the rest of the top substrate.

A method of interconnecting an electrically conductive element outside a sealed cavity to an electrically conductive element within the cavity according to the invention would preferably include the steps of:

providing a bottom substrate (which is usually but not necessary substantially electrically insulating) having top and bottom surfaces;

providing a top substrate (which is usually but not necessary substantially electrically conductive) having top and bottom surfaces where the bottom surface is adapted for attachment to the top surface of the bottom substrate to provide the sealed cavity;

electrically isolating a portion of the top substrate from the rest of the top substrate, the isolated portion having a top surface outside the cavity and a bottom surface facing the top surface of the bottom substrate;

connecting the electrically conductive element outside the cavity to either (1) the top surface of the electrically isolated portion of the top substrate, or (2) the bottom surface of the electrically isolated portion of the top substrate via through holes in the bottom substrate; and connecting the electrically conductive element inside the cavity to the bottom surface of the electrically isolated portion of the top substrate, such that the electrically isolating portion of the top substrate acts as a conductive link between the elements.

In yet another aspect of this invention, an innovative technique is introduced for refilling etched trenches which is high yield, low cost, and high quality.

The scope of the applicability of the present invention will become more apparent from the following detailed description. It should be mentioned, however, that the detailed description and specific examples, while indicating the preferred embodiments of this invention, are given by way of illustration only. As a result, various changes and modifications within the spirit and scope of the invention will become apparent to those skilled in this field.

BRIEF DESCRIPTION OF THE DRAWINGS

FIG. 11A concerns a reactive-ion etch (RIE), dielectric deposition, and polysilicon deposition, FIG. 11B shows a polysilicon etch back with overetching, and FIG. 11C shows a second polysilicon deposition and etch back.

DETAILED DESCRIPTION OF THE INVENTION

Although this invention is ideally suited to the design, fabrication, and manufacturing of capacitive absolute pressure sensors, in particular for ultra-high-vacuum applications, the teachings set forth herein may be used in many other devices and fields of endeavor, including flow sensors, flow controllers, gyroscopes, accelerometers, yaw sensors, force sensors, diaphragm-type actuators, resonating devices, telecommunication devices (such as mechanical filters, oscillators, etc.), and optical devices such as infrared detectors, CCD cameras, and flat-panel displays.

It should also be understood that all terms relating to direction, shape, and geometry, including "U-shaped" ring, "O-shaped" trench, and references to an upper or lower surface (or the inside and outside) of a component are used only as exemplary and are not meant to limit the invention to any particular configuration or to use in any particular orientation.

In addition, for the sake of simplicity and clarity in describing important aspects of this invention, the description is based on capacitive pressure sensors, with the understanding that the methods and apparatus are applicable to all fields and types of devices that could benefit from a conveniently accessible electrical lead transfer from inside a cavity (which may be open or sealed, whether at vacuum or otherwise controlled) to the outside environment.

Figure 1:
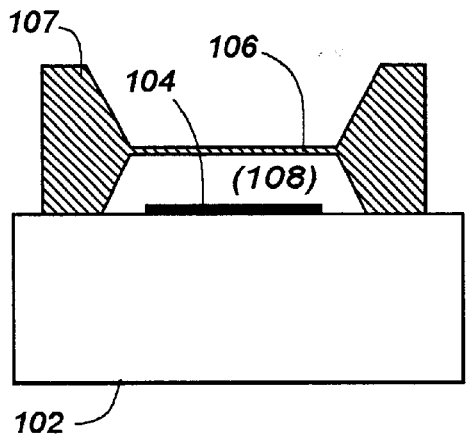
FIG. 1 is a cross-section of a typical, prior-art silicon capacitive pressure sensor.

The basic structure of a micromachined pressure sensor fabricated using a dissolved wafer process (DWP) is shown in FIG. 1. It should be noted that this invention can be used for pressure sensors that are made using fabrication technologies other than DWP; DWP is selected as a matter of convenience. The capacitive pressure sensor consists of a glass substrate 102 which supports both a bottom electrode 104 and a micromachined diaphragm 106 supported by an outer rim 107. The diaphragm is typically formed using a heavy boron diffusion into a standard silicon wafer, bonding the wafer to the substrate 102, and then dissolving away the undoped silicon areas in a concentration-dependent etchant.

A cavity 108 is created between the diaphragm 106 and the bottom electrode 104, such that as external pressure is changed relative to the cavity 108 pressure, the diaphragm 106 deflects, thus changing the capacitance, thereby providing an indication of the pressure change. A differential pressure sensor version of the absolute device can be fabricated, for example, by creating a hole in the bottom substrate. Such differential pressure sensors can be used to design and manufacture differential-pressure-based flow sensors. As fluid flows in a micromachined flow tube fabricated adjacent to the pressure sensor, a pressure difference is generated which can be reliably measured. The pressure difference and the resistance of the flow tube are then used to obtain an accurate measure of the flow.

The bottom electrode 104 must be electrically accessed, as it forms one plate of the capacitive sensor. However, since the silicon rim 107 is electrically conductive, the rim cannot be placed directly on top of any lead transfer lines or electrical shorting will occur. In addition, a metalization pattern on the glass may prevent a hermetic sealing between the silicon rim and the glass substrate. It is therefore not possible to seal the pressure sensor without additional processing steps.

Figure 2:
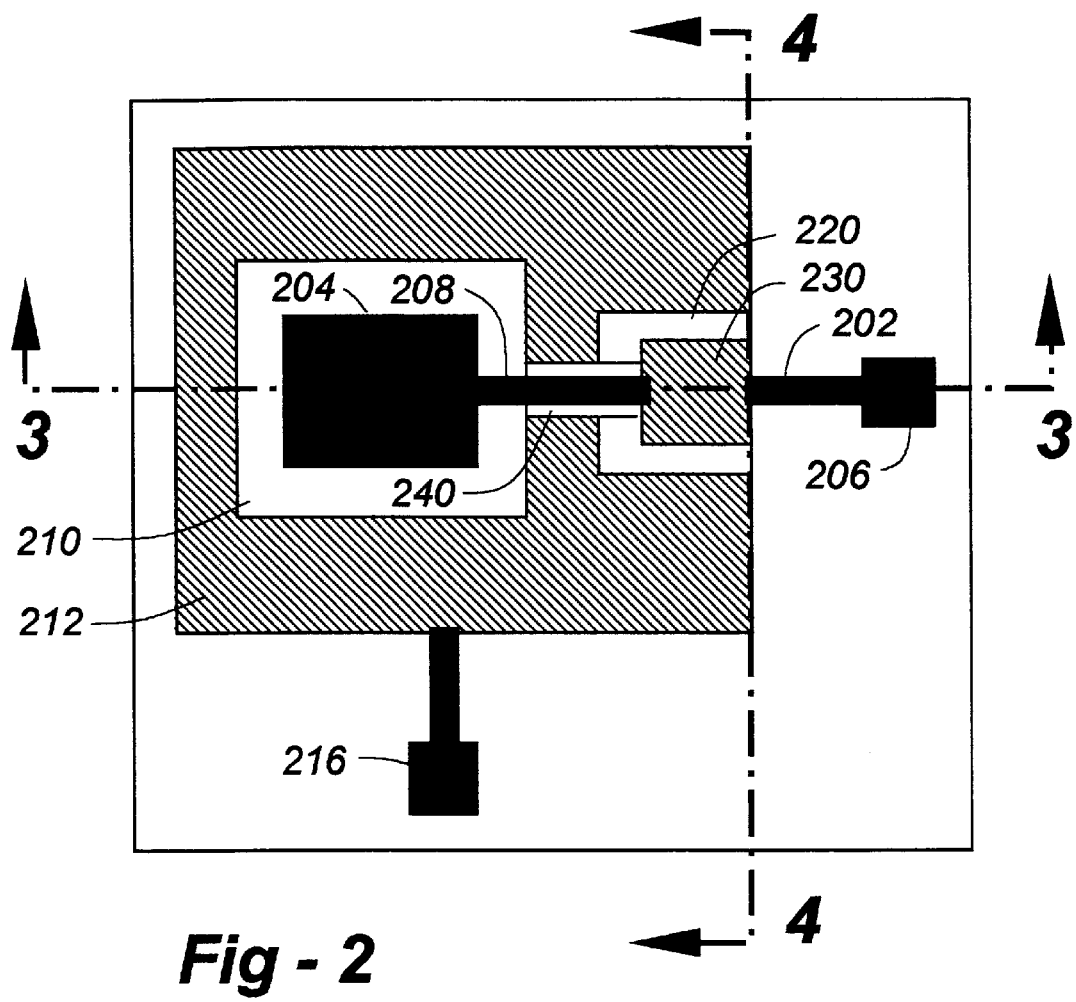
FIG. 2 illustrates a top view of a U-shaped trench lead-transfer and sealing technology according to the invention.
Figure 3:
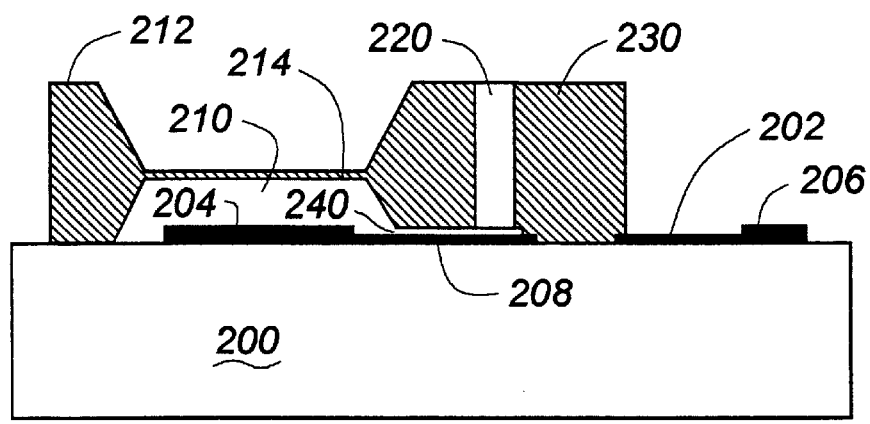
FIG. 3 is a cross section taken along plane A—A of FIG. 2.
Figure 4:
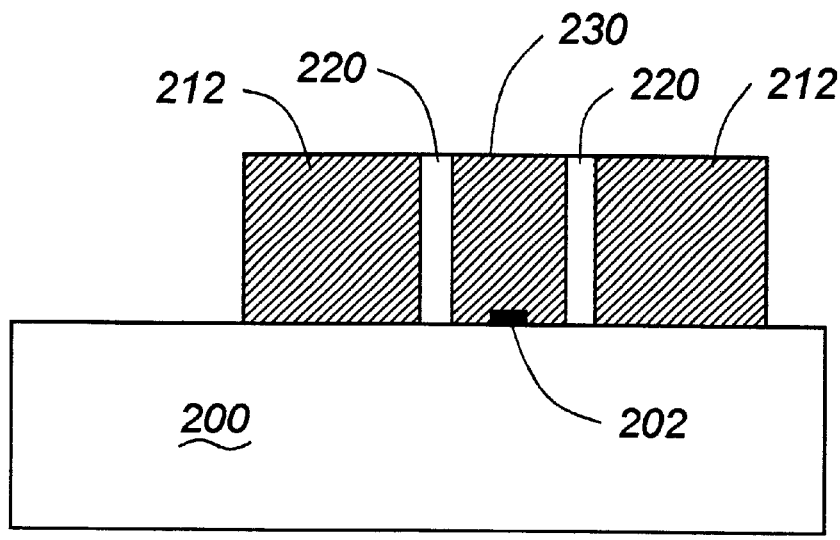
FIG. 4 is a cross section taken along plane B—B of FIG. 2.
Figure 5:
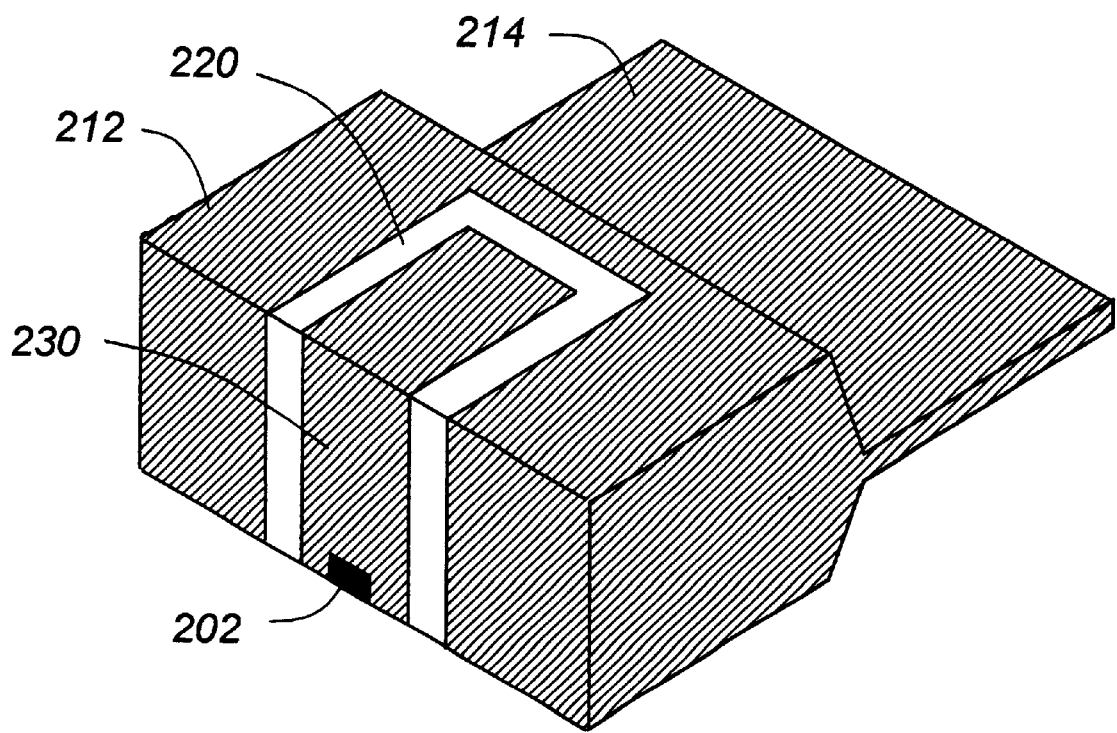
FIG. 5 is an oblique diagram of a lead-transfer aspect of the invention.

This invention addresses this problem by providing an excellent hermetic sealing of the cavity and an electrical lead transfer mechanism performed at the wafer level applicable to multiple feedthroughs. A top-view schematic of the basic structure is shown in FIG. 2. Section A—A is shown in FIG. 3, whereas section B—B is depicted in FIG. 4. FIG. 5 is a close-up, perspective representation of the rim around the lead transfer area.

In using this basic approach, one part of the rim 230 is electrically isolated from the rest of the rim 212, while allowing the hermetic sealing of the entire rim 212 to be maintained. A metal line connecting the fixed metal capacitor plate 204 to the electrical pad 206 is broken into two parts 202, and 208. One part 208 is placed inside the cavity 210, while the other part 202 is placed outside the rim 212. Both metal parts 202 and 208 touch an electrically-isolated portion 230 (i.e., the electrical lead transfer feedthrough) of the rim 212 without touching the rest of the rim.

A major advantage of this approach is that since the silicon rim is attached directly to the top of the glass substrate without a dielectric interface layer or penetrating metalization, the rim can be reproducibly bonded to the glass substrate with excellent quality and hermeticity. There are also no apertures through the glass associated with lead transfer, thereby obviating sealing and outgassing problems that accompany solder refill. Furthermore, multiple lead transfer feedthroughs are possible using this invention.

To create an electrically-isolated portion of the rim for lead transfer, a thin (e.g., one- to ten-micron wide) U-shaped part 220 of the rim is etched. Different methods can be used for such silicon etching including but not limited to reactive ion etching (RIE), deep reactive ion etching (using tools from companies such as Plasmatherm and STS), and wet etching.

After the etching step, the trench is refilled with one or more dielectric material, as best seen in FIGS. 2 to 5. This U-shaped trench 220 is first etched and then refilled with dielectric, such as silicon dioxide and/or silicon nitride. The trench can be refilled with a dielectric material in a number of different ways according to the invention. In one approach, thermally grown silicon oxide can be used as the refill material. LPCVD silicon oxide and/or silicon nitride can also be deposited as the refill dielectric material. For better refill, in particular for wider trenches, a sandwich of silicon oxide, silicon nitride and polysilicon can be deposited using, for example, LPCVD techniques. A combination of thermally-grown silicon oxide and a variety of deposited LPCVD films can also be used. Since different techniques may be used to refill the trench 220 with dielectric materials, the choice of a particular material should not be taken to limit this invention.

Following the formation and refill of the trench 220, the top substrate (e.g., silicon wafer) is attached to the bottom substrate 200 (e.g., glass wafer). Different substrate materials and attachment techniques may also be used in accordance with the invention. For example, glass, silicon and a variety of ceramic materials can be used as either substrates. The different attachment techniques include, but are not limited to, anodic bonding, fusion bonding, eutectic bonding, thermal bonding (e.g., to frit glass or other deposited thin layers), compression bonding, and thermal compression bonding. Although different substrates and attachment techniques are part of this invention, they are not meant to limit this invention.

FIG. 3, which is a cross section taken along view A—A of FIG. 2, shows how the electrically conductive U-shaped lead transfer part 230 interconnects the inner metal line 208 to the outer metal line 202 and pad 206.

The metal line 208 is electrically connected to the electrically conductive U-shaped lead transfer part 230 via a tunnel 240 in order to prevent electrical shorting of the metal line 208 to the rest of the rim 212, as perhaps best seen in FIG. 3. The tunnel can be created by dry (e.g., RIE) or wet etching of either the bottom substrate (e.g., glass wafer) or the top substrate (e.g., silicon wafer), or both.

The top silicon substrate is preferably anodically bonded to the bottom glass substrate to provide an excellent hermetic sealing. Of concern is the planarity of the area around the U-shaped refilled trench, which preferably must be controlled to within a few hundreds of an Angstrom. Otherwise, the U-shaped trench may act as a leak tunnel to carry gases from the outside environment into the sealed cavity. One solution involves the use of a chemical-mechanical polishing (CMP) processing step before the anodic bonding in order to guarantee the required planarity.

Figure 6:
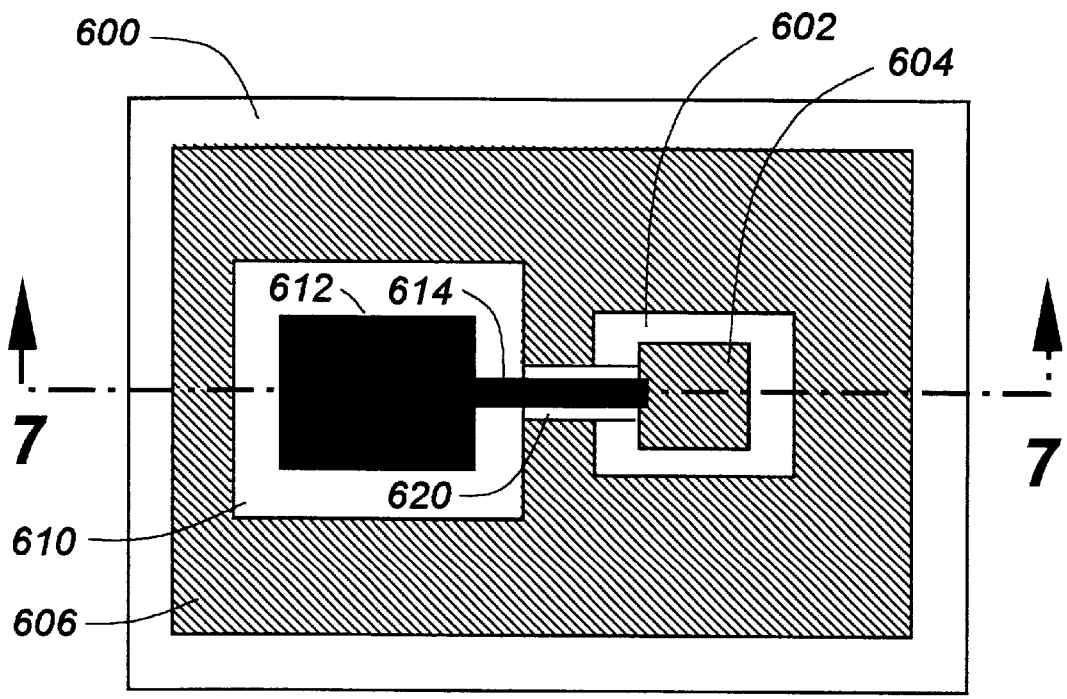
FIG. 6 is a top view of an O-shaped trench lead-transfer and sealing arrangement according to the invention.
Figure 7:
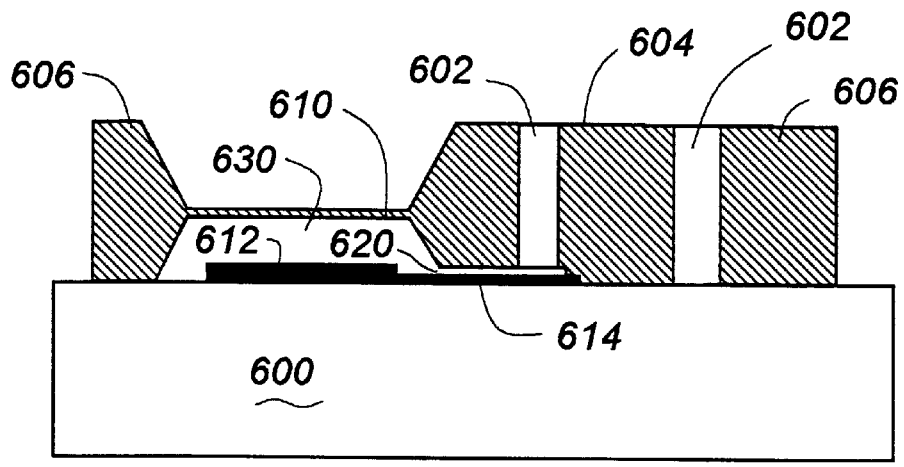
FIG. 7 is a cross section taken with respect to plane C—C of FIG. 6.

An alternative solution uses an O-shaped lead-transfer arrangement, as shown in FIGS. 6 and 7. In this case, the trench 602 features a closed perimeter shape (such as circular, oval, square, rectangular, or any other closed geometry), so that it is now completely surrounded by silicon, both inside (604) and outside (606). The silicon rim 606 surrounding the refilled trench provides an excellent hermetic sealing ring since it is anodically bonded to the glass substrate at all surrounding points. As a result, unlike the U-shaped lead transfer technology, the refilled trench is now isolated and thus is not exposed to ambient gases. Moreover, the trench area no longer requires the same planarity (i.e., better than 100 Angstrom) as the silicon rim. Furthermore, multiple lead transfer feedthroughs are possible using this invention.

Figure 8:
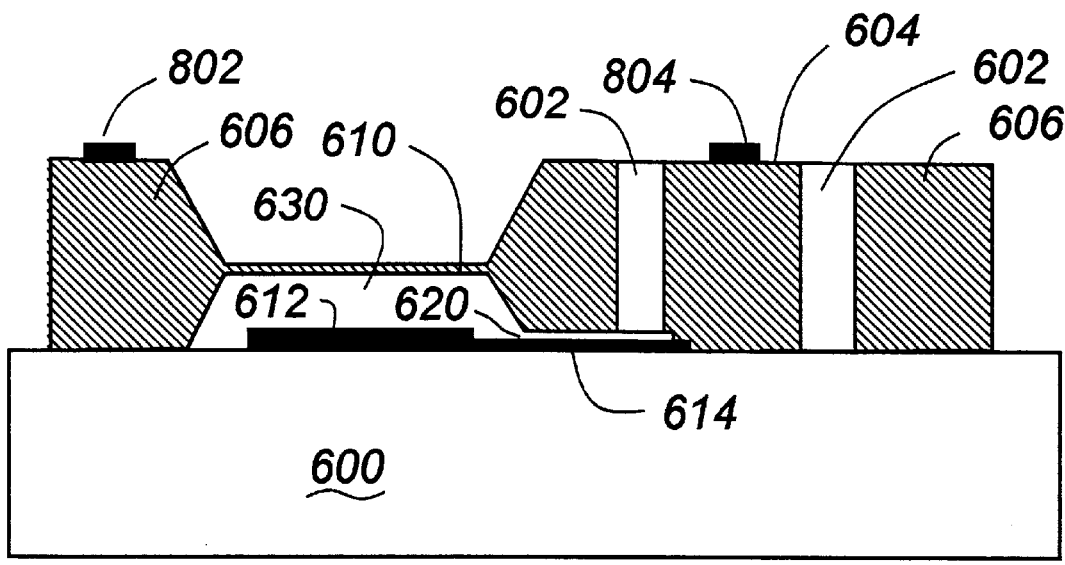
FIG. 8 is a cross-section which includes metal pads on the top side of a silicon rim.

An important consideration of the O-shaped trench approach of FIG. 6 is how to electrically access the capacitor plates (diaphragm 610 and metal plate 612 through metal line 614 and tunnel 620) from outside, for example, to connect the sensor chip to a package. One approach is shown in FIG. 8, where the electrical access is via points 802 and 804 on top of the silicon side of the sensor. Different techniques can be applied with respect to a top-side electrical connection, including wire-bonding techniques or "flip-chip" bonding techniques wherein conductive bumps or studs are deposited on top of the isolated island and the rim. For ease of production, metal pads 802 and 804 may first be deposited on the rim and on top of the isolated island, respectively, with the wire bonding or flip chip bonding techniques being used in conjunction with these metal pads. The pads can be deposited using a variety of techniques; for example, using standard photolithography and metalization or shadow masking to avoid the need for photolithography steps. It should be mentioned that this invention is not restricted to the type of flip chip bonding performed for electrical connection, as the invention covers all type of flip-chip bonding techniques.

Figure 9:
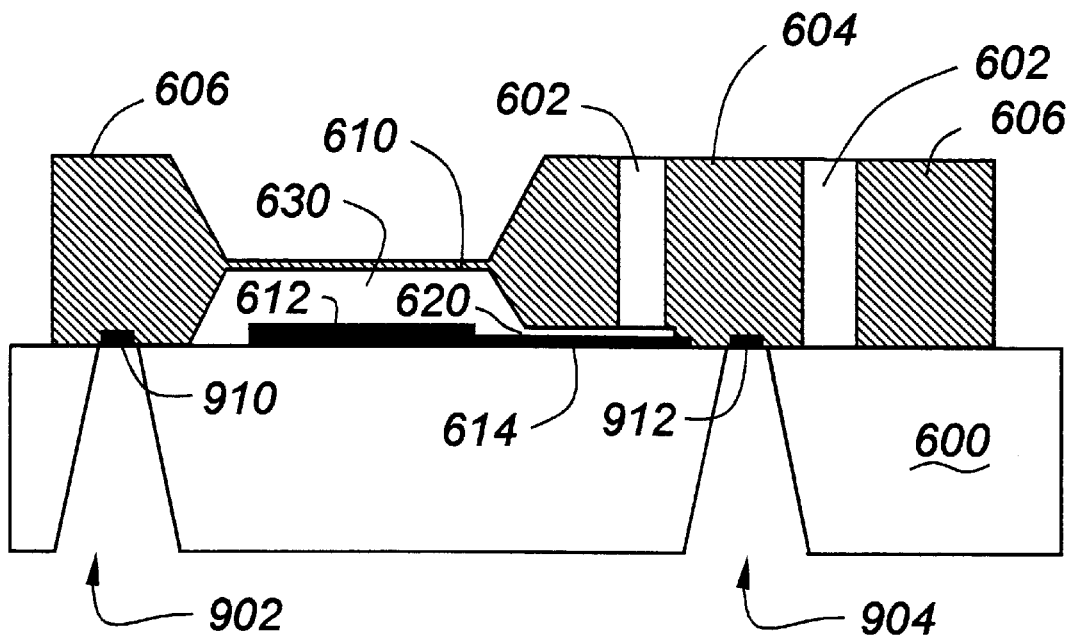
FIG. 9 illustrates an electrical connection from bottom of a glass substrate.

Another approach to provide electrical access to the capacitance plates is shown in FIG. 9, wherein one or more vias 902 and 904 are formed in the bottom substrate of the assembly. The silicon around the access holes provides a hermetic sealing since it is anodically bonded to glass. The access holes in the bottom substrate (e.g., glass) can be created using a variety of different techniques, including but not limited to mechanical drilling, ultrasonic drilling machining, laser drilling/etch, abrasive drilling, sand blasting, and wet etch.

Again, both wire bonding and a variety of flip-chip bonding technologies can be utilized to electrically connect the sensor chip to its package. In addition, the vias may be filled with a conductive material (for example, with conductive epoxy or solder), enabling the electrical connection to be made to the filled hole, rather than directly to the exposed silicon. For ease of production, metal pads 910, 912, may be first deposited on the silicon wafer (before or after anodic bonding) on top of the isolated island and the rim on the silicon in the back hole area, with the wire bonding, flip-chip bonding, or hole refill process being employed in conjunction with these metal pads.

Figure 10:
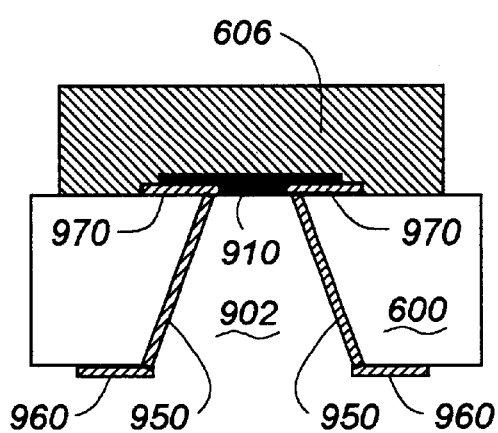
FIG. 10 illustrates an electrical connection from bottom of a glass substrate using deposited metal on the glass.

Another approach to have electrical access through the vias in the bottom glass substrates is shown in FIG. 10. In this approach either before or after the two substrates are bonded together, a layer of metal 950 is deposited and patterned on the back side of the bottom glass substrate. Another optional metal layer 970 can also be deposited and patterned on the top side of the bottom glass substrate in order to provide a better electrical connection. The metalized via 902 can be used for flip chip bonding or a portion 960 of the backside metal layer 950 can be used for either wire bonding or other connection techniques. For better electrical connection an optional layer of metal 910 can be deposited and patterned on the bottom side of the top silicon substrate. In addition, the metalized vias may be filled with a conductive material (for example, with conductive epoxy or solder), enabling the electrical connection to be made to either the filled hole or the metal on glass 960.

Another aspect of this invention resides in an innovative approach to the refill of an etched cavity or trench. Although a specific example of the approach is provided below which uses silicon dioxide and polysilicon as the refill material, it will be apparent to one of skill in the art that other materials or material combinations may be used as the refill material.

Figure 11A:
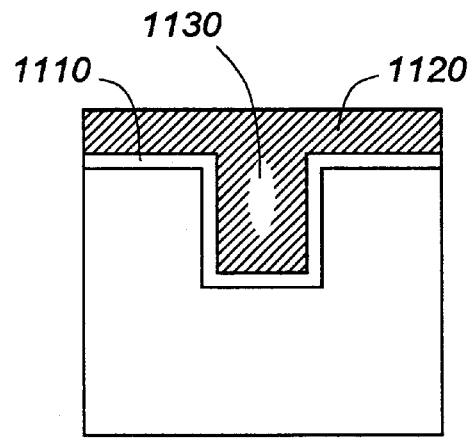
FIGS. 11A–11C reveal a simplified process flow for a polysilicon-refill-trench aspect of the invention wherein, in particular.
Figure 11B:
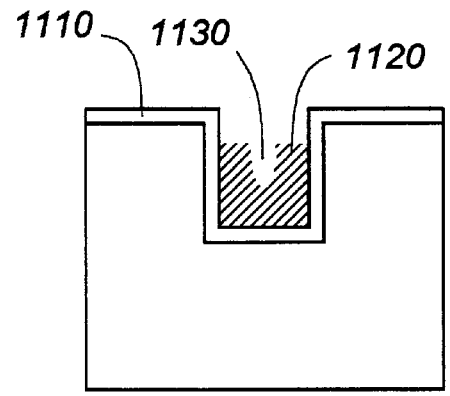
Figure 11C:
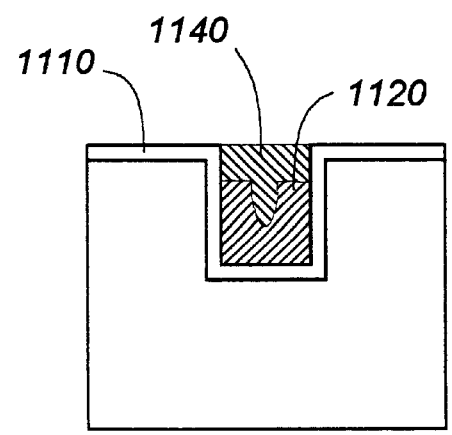

Broadly, in contrast to the standard approach which utilizes one (LPCVD) polysilicon refilling step, the invention uses two refilling steps, as shown in FIG. 11. The preferred method involves the steps of (1) performing a deep etch to form the trench (e.g., using RIE or deep RIE), (2) performing a first LPCVD deposition of a dielectric layer 1110 (such as silicon dioxide and/or silicon nitride) and a polysilicon layer 1120 (FIG. 11A), the dielectric layer can be replaced by thermally grown silicon dioxide (3) performing a first etch back of the polysilicon layer with a great deal of polysilicon overetching (FIG. 11B), (4) performing a second polysilicon LPCVD deposition 1140, (5) and second polysilicon etch back with no or small amount of overetching (FIG. 11C), and (6) stripping the oxide layer if desirable.

According to this method, the excessive polysilicon overetching in the first etch-back step results in an access path 1130 to most of the large voids that were created during the first LPCVD refill step. The second LPCVD deposition step practically refills all the voids that were created during the first refill process. One or more layers can be deposited between the two polysilicon layers, for example silicon dioxide and silicon nitride. The poly silicon layers can also be replaced with other material.

We claim:

1. In a structure of the type wherein the bottom surface of a substantially electrically conductive top substrate is attached to the top surface of a substantially insulating bottom substrate to provide a sealed cavity, an interconnection for interconnecting an electrically conductive element outside the cavity to an electrically conductive element within the cavity, comprising:

a feedthrough section of the top substrate which makes electrical contact to both of the electrically conductive elements; and a thickness of electrically insulating material isolating the feedthrough section from the remainder of the electrically conductive top substrate while maintaining a high quality of cavity sealing.

2. The interconnection of claim 1, wherein only a portion of the bottom surface of the feedthrough section overlaps with portions of the electrically conductive elements, enabling the remainder of the bottom surface of the feedthrough section to be bonded directly to the top surface of the bottom substrate.

3. The interconnection of claim 1, including multiple feedthroughs.

4. The interconnection of claim 1, wherein the feedthrough section of the top substrate includes an outer wall, and wherein the perimeter of the electrically insulating material is a geometrical shape having open ends, and wherein the ends terminate at the outer wall.

5. The interconnection of claim 4, wherein the geometrical shape having open ends is a U-shape.

6. The interconnection of claim 1, wherein the feedthrough section of the top substrate is in the form of an island of conductive material surrounded by both the electrically insulating material and the top substrate, and wherein the perimeter of the electrically insulating barrier is a closed shape, with the electrically insulating material surrounded by the top substrate.

7. The interconnection of claim 1, wherein the electrically conductive element outside the cavity makes contact to the feedthrough section of the top substrate from the top side of the feedthrough section of the top substrate.

8. The interconnection of claim 1, wherein the electrically conductive element outside the cavity makes contact to metal pads deposited on the top surface of the bottom substrate wherein the metal pads are connected to the feedthrough portion of the top substrate.

9. The interconnection of claim 1, wherein the electrically conductive element outside the cavity makes contact to the bottom side of the feedthrough portion of the top substrate by way of a via formed into the bottom substrate.

10. The interconnection of claim 1, wherein the electrically conductive element within the cavity forms part of a capacitor electrode.

11. The interconnection of claim 1, wherein the electrically conductive element within the cavity forms part of a pressure sensor.

12. The interconnection of claim 1, wherein the electrically conductive element within the cavity forms part of a flow sensor.

13. The interconnection of claim 1, wherein the electrically conductive element within the cavity forms part of a micromachined sensor.

14. The interconnection of claim 1, wherein the electrically conductive element within the cavity forms part of a micromachined actuator.

15. The interconnection of claim 1, wherein the electrically conductive element within the cavity forms part of a resonating device.

16. The interconnection of claim 1, wherein the electrically conductive element within the cavity forms part of the package of a micromachined device.

17. The interconnection of claim 1, wherein the thickness of the electrically insulating material is disposed within a trench formed in the top substrate.

18. The interconnection of claim 1, wherein the cavity is substantially evacuated.

19. The interconnection of claim 1, wherein the cavity is filled with one or a mixture of gases.

20. The interconnection of claim 1, wherein the cavity is pressurized.

* * * * *

UNITED STATES PATENT AND TRADEMARK OFFICE
CERTIFICATE OF CORRECTION

PATENT NO.   : 6,338,284 B1  Page 1 of 1
DATED        : January 15, 2002
INVENTOR(S)  : Nader Najafi et al.

It is certified that error appears in the above-identified patent and that said Letters Patent is hereby corrected as shown below:

Drawings,
Correct Fig. 1 - insert -- Prior Art --.

Signed and Sealed this

Twenty-fourth Day of December, 2002

JAMES E. ROGAN
*Director of the United States Patent and Trademark Office*